(12) United States Patent
Low et al.

(10) Patent No.: US 6,768,150 B1
(45) Date of Patent: Jul. 27, 2004

(54) MAGNETIC MEMORY

(75) Inventors: Kia Seng Low, Hopewell Junction, NY (US); Joerg Dietrich Schmid, Hopewell Junction, NY (US)

(73) Assignee: Infineon Technologies Aktiengesellschaft, Munich (DE)

( * ) Notice: Subject to any disclaimer, the term of this patent is extended or adjusted under 35 U.S.C. 154(b) by 0 days.

(21) Appl. No.: 10/249,532

(22) Filed: Apr. 17, 2003

(51) Int. Cl.[7] .............................................. H01L 29/76
(52) U.S. Cl. .................... 257/295; 257/68; 257/71; 257/296; 257/298; 257/326; 257/529; 257/530; 438/3; 438/240; 438/131; 438/132; 438/215; 438/281; 438/601
(58) Field of Search .................... 257/68, 71, 295–314, 257/324–326, 30, 173, 529, 530, 665, 910; 438/3, 240, 2, 131, 132, 215, 281, 333, 467, 600, 601, 902, 957

(56) References Cited

U.S. PATENT DOCUMENTS 6,473,337 B1 * 10/2002 Tran et al. .................. 365/173

* cited by examiner

*Primary Examiner*—David Nelms
*Assistant Examiner*—Andy Huynh
(74) *Attorney, Agent, or Firm*—Slater & Matsil, L.L.P.

(57) ABSTRACT

A magnetic memory cell is disclosed. The memory cell includes first conductor and second conductors coupled to first and second electrodes of a magnetic element. A plurality of memory cells is interconnected by first and second conductors to form a memory array or block. The second conductor is coupled to the second electrode via a conductive strap having a fuse portion. The fuse portion can be blown to sever the connection between the second conductor and magnetic element, Nitride.

15 Claims, 11 Drawing Sheets

MAGNETIC MEMORY

BACKGROUND OF INVENTION

Ferromagnetic elements are used, for example, to form non-volatile memory cells. FIG. 1 shows a conventional ferromagnetic memory cell 105. As shown, the magnetic cell includes a magnetic element 106 having top and bottom magnetic layers 110 and 130. The magnetic layers serve as electrodes of the magnetic element. The magnetic layers, for example, comprise cobalt-iron or nickel-cobalt-iron. A non-magnetic layer 120 separates the first and second magnetic layers. The non-magnetic layer, for example, comprises an insulating material, such as aluminum oxide, to form a magnetic tunnel junction (MTJ) type element.

First and second conductors 140 and 150 are coupled to the electrodes (e.g., top and bottom magnetic layers). One conductor is referred to as the bitline and the other is referred to as the wordline. The bitline and wordline are orthogonal to each other. A plurality of magnetic cells 105 are interconnected by wordlines $150_{1-n}$ and bitlines $140_{1-m}$ to form an array, as shown in FIG. 2. Cells, depicted by the resistor symbols, are located at intersections of wordlines and bitlines.

The magnetic element is typically rectangular or elliptical in shape, having a width and length L. The magnetic layers of the cell are formed with an easy axis along the length L and a hard axis along the width. The magnetic vector in the bottom layer is fixed or pinned in a first direction parallel to the easy axis. The bottom layer with the fixed magnetic vector is referred to as the reference or fixed layer. The magnetic vector in the top magnetic layer can be switched between first and second (opposite) directions parallel to the easy axis. As such, the magnetic vectors in the layers can be oriented parallel or antiparallel to each other. The top magnetic layer with switchable magnetic vector is referred to as the storage or free layer.

The direction of the vectors in the top layer can be switched by the application of a magnetic field generated by passing a current through one or both conductors. Depending on the magnetic field generated, the magnetic vector in the second layer either switches direction or remains the same. The magnetic element would have first and second resistance values based on whether the magnetic vectors are oriented parallel or anti-parallel, representing first and second logic states stored. For example, the magnetic element will have a high resistance value when the vectors of the layer are antiparallel to represent a logic 1 or a low resistance when the vectors are parallel to represent a logic 0. The states stored in the element can be read by passing a sense current through the element and sensing the difference between the resistances.

However, shorting across the non-magnetic layer of a cell, a common failure mode, creates a current path between the wordline and bitline to which the cell is coupled. Since the cell is not isolated from the wordline or bitline, the current path created by the shorted cell can render the array defective.

From the above discussion, it is desirable to reduce the adverse impact of a defective MRAM cell to the memory array.

SUMMARY OF INVENTION

The invention relates to magnetic memory cells. In one embodiment, a memory cell includes a magnetic element having first and second electrodes. A first conductor is coupled to the first electrode of the magnetic element. A second conductor is coupled to the second electrode of the magnetic element. In one embodiment, the second conductor is coupled to the second electrode via a conductive strap. The conductive strap produces a coupling which is offset by a distance x between the second conductor and magnetic element. The conductors can be formed from, for example, copper, aluminum, alloys or combination thereof. The conductive strap comprises, for example, tantalum nitride. A plurality of memory cells are interconnected by first and second conductors to form a memory array or block.

In accordance with the invention, the conductive strap comprises a fuse portion which can be severed to decouple the second conductor from the magnetic element. In one embodiment, the fuse portion comprises an electrically blowable fuse portion. The electrically blowable fuse portion can be blown by, for example, passing an elevated current through the strap. By providing the strap with a fuse portion, a magnetic element can be decoupled from the array by blowing the fuse portion.

DETAILED DESCRIPTION

Figure 1:
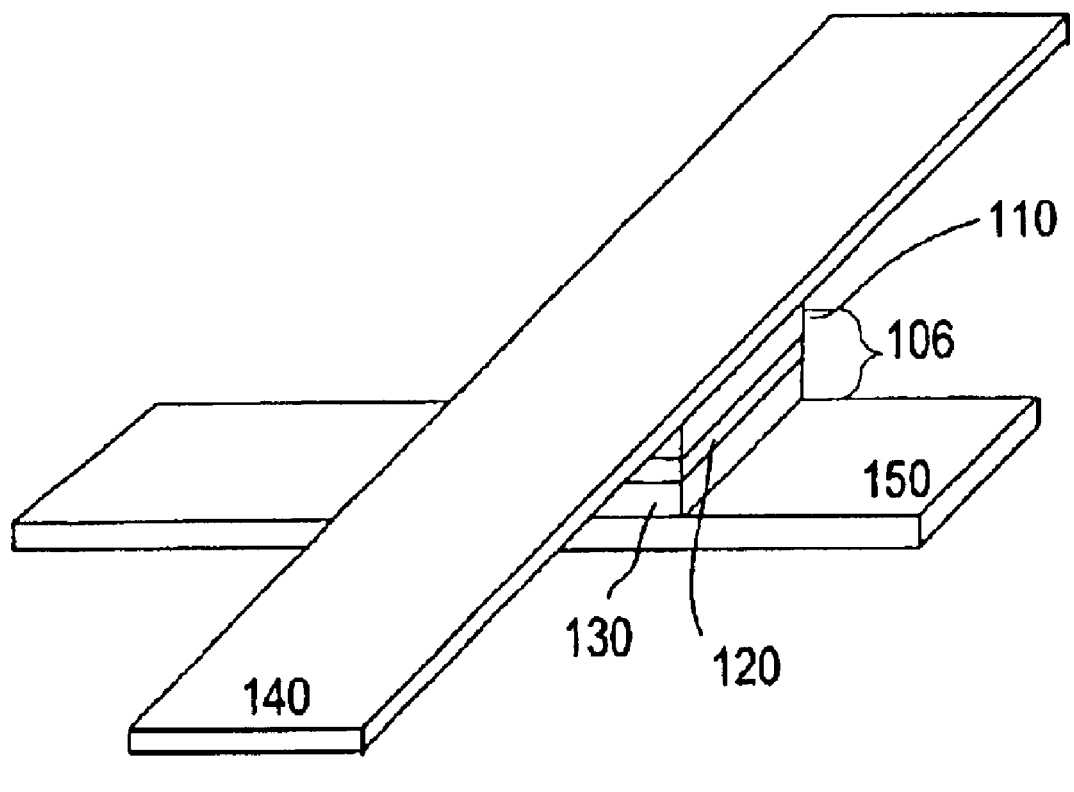
FIG. 1 shows a three dimensional view of a magnetic memory cell.
Figure 2:
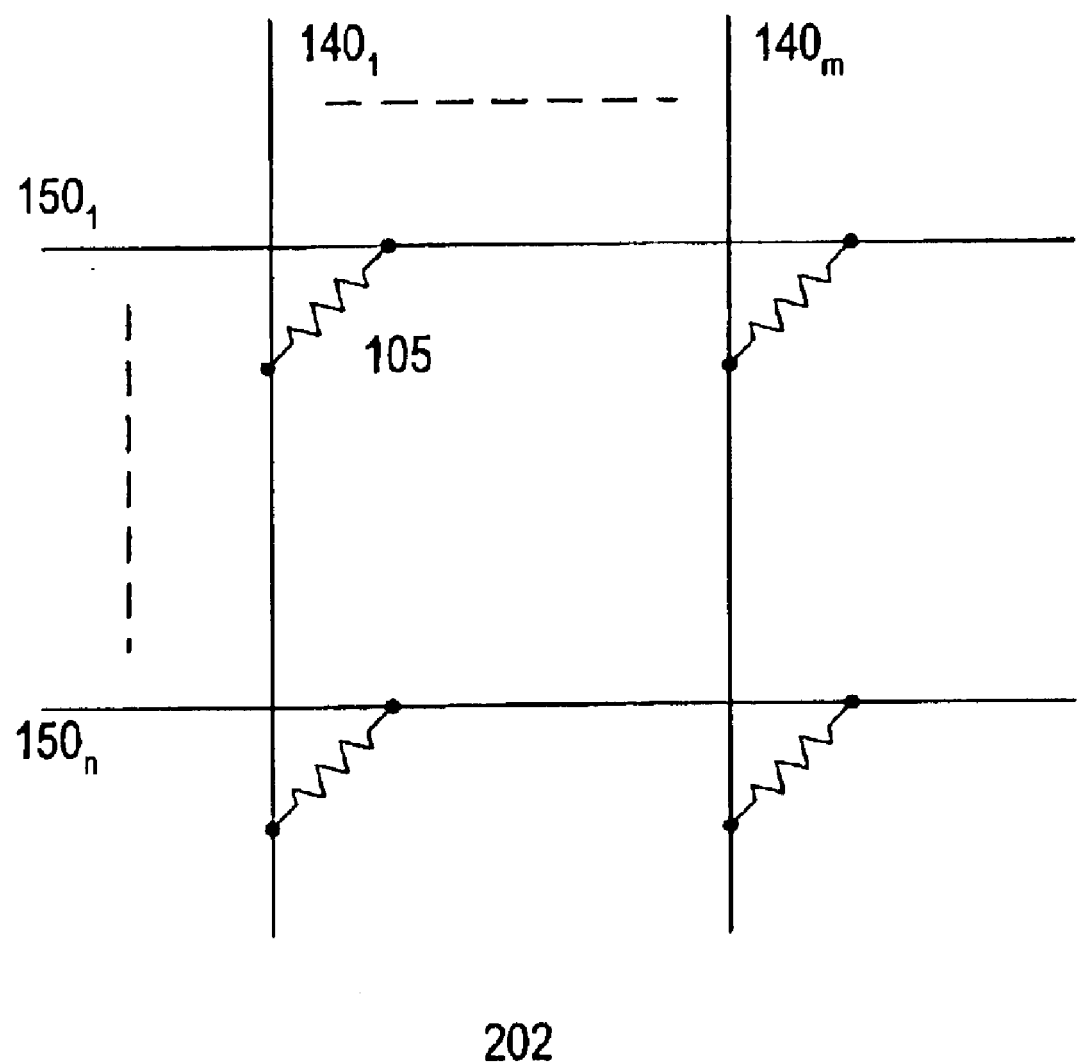
FIG. 2 shows a memory array of magnetic cells.
Figure 3:
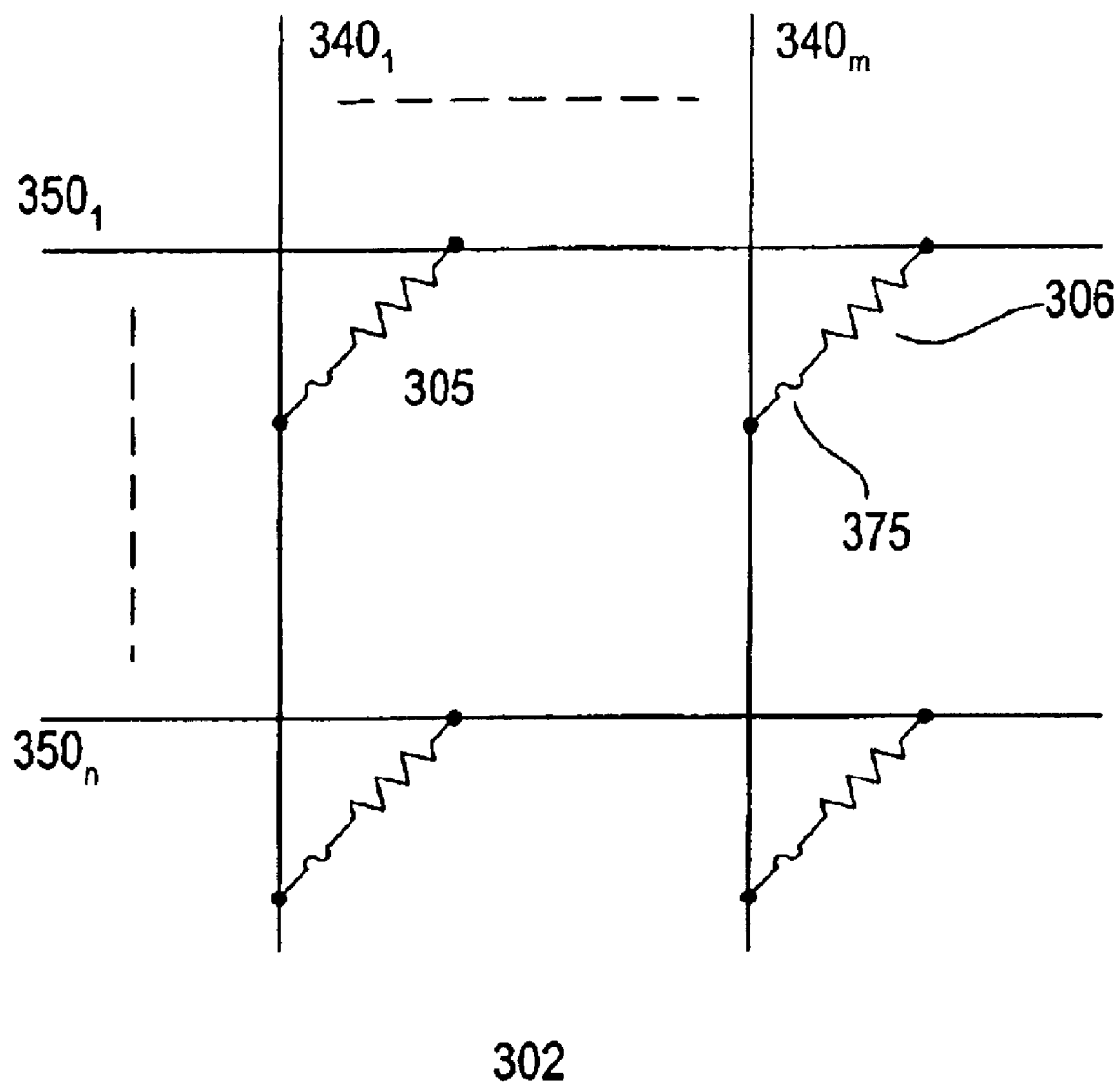
FIG. 3 shows a memory array of magnetic cells in accordance with one embodiment of the invention.

FIG. 3 shows a MRAM memory array in accordance with one embodiment of the invention. The array comprises a plurality of magnetic memory cells 305 interconnected by first and second conductors $340_{1-m}$ and $350_{1-n}$. First or second conductors are referred to as bitlines while the others are referred to as wordlines. The array includes support circuitry (not shown), such as decoders and sense amplifiers to facilitate memory accesses (e.g., reads or writes). As shown, the first and second conductors are orthogonal. Providing conductors which intersect at other angles are also useful.

Memory cells are located at the intersection of first and second conductors. In one embodiment, a memory cell comprises a magnetic element 306. The magnetic element comprises first and second electrodes. The electrodes comprise magnetic layer or layers. A non-magnetic layer separates the electrodes. The non-magnetic layer can be conductive or non-conductive. Preferably, the non-magnetic layer comprises a non-conductive layer, such as aluminum oxide, to create a MTJ magnetic element. One electrode is coupled to a first conductor and the second electrode is coupled to a second conductor.

One of the electrodes is coupled to one of the conductors via a fuse 375. In one embodiment, the second electrode is coupled to the second conductor via a fuse. Coupling the first electrode to the first conductor via a fuse is also useful. It is also useful to couple the second conductor to the first electrode via a fuse or vice-versa.

In accordance with one embodiment of the invention, the fuse can be blown to sever the connection of the memory cell to the second conductor. Preferably, the fuse comprises an electrically blowable fuse which can be blown by an elevated current. The elevated current is, for example, greater than the normal operating current. Preferably, the elevated current is sufficiently greater than the normal operating current to avoid blowing the fuse unintentionally due to variations in operating parameters. By providing a fuse, a memory cell can be decoupled from the array by blowing the fuse. As such, a defective memory cell can be isolated, thus avoiding failure to the whole memory array.

Figure 4:
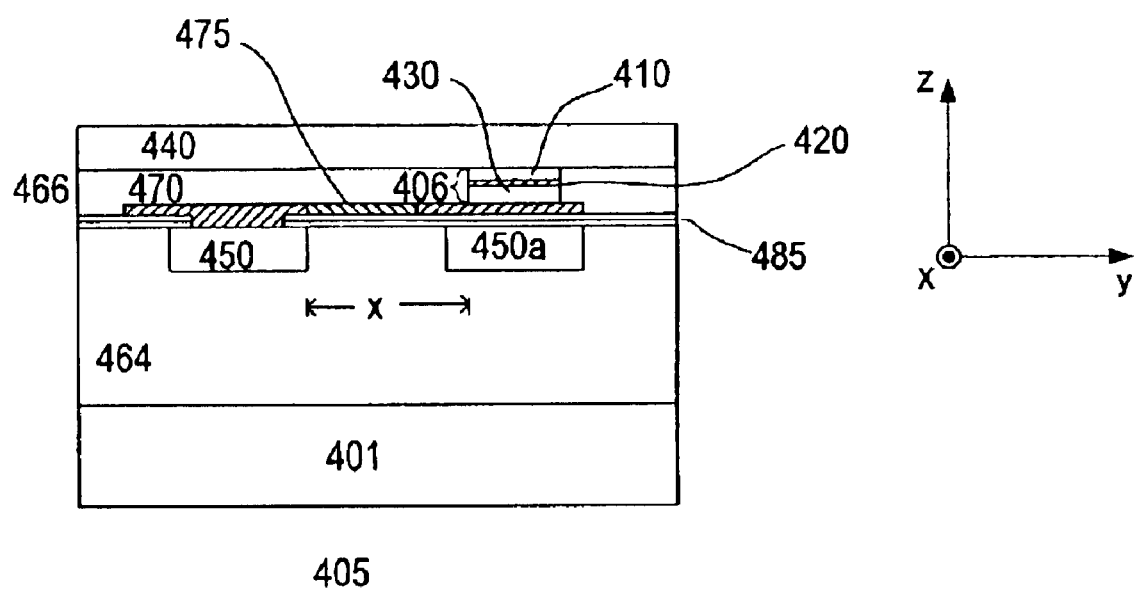
FIG. 4 shows a memory cell in accordance with one embodiment of the invention.

FIG. 4 shows a cross-section of a memory cell 405 in accordance with one embodiment of the invention. The memory cell is formed on a substrate 401. In one embodiment, the substrate is prepared with a dielectric layer 464, such as silicon oxide. Other dielectric materials are also useful. Below the dielectric layer, support circuitry and other circuit elements are provided. The memory cell is formed in or on the dielectric layer.

The memory cell includes a magnetic element 406 comprising first and second electrodes 410 and 430. The electrodes are formed of ferromagnetic materials, such as nickel, iron, cobalt, alloys or combinations thereof. For example, the electrodes can be formed of nickel-iron, nickel-iron-cobalt, or cobalt iron. Other types of ferromagnetic materials are also useful. It is understood that the first and second electrodes need not be formed of the same materials. For example, one of the layers comprises nickel-iron (NiFe) and the other comprises cobalt-iron (CoFe).

In one embodiment, the storage layer comprises NiFe and the reference layer comprises multiple layers. In one embodiment, the reference layer comprises first and second magnetic layers separated by a conductive layer. The reference layer comprises, for example, a first magnetic layer of either CoFe or NiFe and a second magnetic layer of CoFe separated by a ruthenium (Ru) layer. Other combinations of magnetic and conductive materials are also useful. Providing one or both electrodes having multi-layers of magnetic materials is also useful. A multi-layered electrode can also be formed with a combination of ferromagnetic and non-ferromagnetic conductive layers.

In another embodiment, the reference layer further comprises an antiferromagnetic layer. The antiferromagnetic layer comprises, for example, platinum manganese (PtMn). Other antiferromagnetic materials are also useful. A conductive barrier or seed layer, such as tantalum nitride can be disposed below the antiferromagnetic layer. The antiferromagnetic layer increases the pinning effect on the reference layer. The magnetization of the antiferromagnetic layer can be aligned by subjecting it to an external magnetic field at elevated temperatures.

In one embodiment, the reference layer (from the intermediate layer) comprises first magnetic layer, conductive layer, second magnetic layer, and antiferromagnetic layer. In one embodiment, the first magnetic layer comprises either CoFe or NiFe, the conductive layer comprises Ru, the second magnetic layer comprises CoFe, and the antiferromagnetic layer comprises PtMn. Other combinations of magnetic, conductive, and antiferromagnetic materials are also useful. The thickness of the various layers are selected to achieve the desired characteristics. For example, the thickness of the first magnetic layer is about 2 nm, the conductive layer is about 1 nm, the second magnetic layer is about 2 nm, and the antiferromagnetic layer is about 20 nm. Other thicknesses are also useful.

The first and second electrodes are separated by a non-magnetic intermediate layer 420. In one embodiment, the non-magnetic layer comprises an insulating material, such as aluminum oxide. Other types of insulating materials, including magnesium oxide or tantalum oxide, are also useful. Separating the magnetic layers with an insulating element creates a MTJ element. Forming other types of magnetic elements is also useful. For example, the electrodes can be separated by a conductive layer, such as copper(Cu) or Ru, to create a GMR element.

The magnetic element generally is rectangular or elliptical in shape having a length L and a width. Furthermore, other cell shapes are also useful. In one embodiment, the magnetic element is formed with an easy axis of magnetization along its length L and a hard axis parallel to its width. The length, for example, is about 70 400 nm. Typically, the length to width ratio of the magnetic element is about 2–4. Other dimensions or length to width ratios are also useful. Providing a cell shape having length larger than the width is preferable since such configuration aligns the magnetization of the layers along the direction of the length (parallel or anti-parallel) by shape anisotropy.

As illustrated, the length is parallel to the x-axis and width is parallel to the y-axis. The magnetic element comprises first and second ends along the length of the element. The magnetic vectors in the layers are aligned parallel to the easy axis (e.g., parallel to length of element). Aligning the magnetic vectors of the layers in other directions is also useful. Aligning the magnetic vectors of the layers along a preferred direction (e.g., length) can also be achieved by other techniques, such as intrinsic anisotropy. This is particularly useful for other cell shapes or aligning the magnetic vectors in directions other than along the length.

In one embodiment, one of the electrodes comprises a magnetic vector which is fixed or pinned in a first direction parallel to the easy axis (e.g., length of element), creating the reference layer. The first direction, for example, is in the positive x-direction (out of the drawing). The magnetic vector is fixed by a having higher field coercivity than that of the storage layer, either by having thicker layer or by exchange bias and/or the use of a antiferromagnetic layer. The other electrode comprises a magnetic vector which can be switched between first and second directions along the easy axis, creating the storage or free layer. Other types of magnetic elements, such as those with switchable magnetic vectors in both electrodes, are also useful. In a preferred embodiment, the reference layer is located below the non-magnetic layer while the storage layer is located above the non-magnetic layer.

First and second conductors 440 and 450 are coupled to the magnetic element. The conductors comprise, for example, copper or copper alloy. Other conductive materials, such as aluminum, are also useful to form the conductors. In one embodiment, the first and second conductors are orthogonal to each other. Illustratively, the first conductor is along the y-axis and the second conductor is along the x-axis. Providing first and second conductors which intersect at other angles is also useful. The first conductor is coupled to one of the electrodes and the second conductor is coupled to the other electrode.

In one embodiment, the first conductor is located above the magnetic element and is coupled to the top electrode and the second conductor is located below the magnetic element and is coupled to the bottom electrode. Other coupling arrangements are also useful. For example, the first conductor can be coupled to the second electrode and the second conductor can be coupled to the first electrode. At least one of the conductors is coupled to the magnetic element via a conductive strap 470. The strap allows the coupling between the conductor and magnetic element to be offset (e.g., coupling which is a distance x away from the magnetic element). In one embodiment, the strap is orthogonal to the direction of the conductor to which it couples. Providing a strap having other angles to the direction of the conductor to which it couples is also useful.

In a preferred embodiment, the strap comprises a conductive layer which forms part of the magnetic element. For example, in the case of composite or multilayered electrodes, the strap can be formed from one or more of the layers of the electrode. In one embodiment, the strap comprises the seed or conductive barrier of the electrode, such as tantalum and/or tantalum nitride. Alternatively, the strap can be formed using the antiferromagnetic layer of the reference electrode. Other conductive materials are also useful to form the strap.

The strap includes a fuse portion 475. The fuse portion, when blown, severs the connection between the conductor and magnetic element. In one embodiment, the fuse portion comprises an electrically blowable fuse. The fuse is blown by, for example, passing an elevated current through the strap. In one embodiment, an elevated current comprises a current which is greater than the normal operating current. Preferably, the elevated current should be sufficiently higher than the normal operating current to avoid inadvertently blowing the fuse during normal operation. The fuse portion, for example, comprises a narrowing of the strap.

The use of electrical fuses enable repairs both before and after the IC is packaged. For example, if a defective cell is detected, an elevated current is passed through the appropriate conductor of the array to blow the fuse associated with the defective cell. The defective cell can be identified by, for example, resistance measurement techniques. Alternatively, the fuse portion comprises a laser blowable fuse. Such fuses can be blown prior to the IC being packaged. Defective cells identified at the wafer level can have the fuses blown during testing.

In one embodiment, the conductor 450 below the magnetic element is coupled thereto via a strap. The other conductor 440 located above the magnetic element is coupled directly or indirectly via a contact to the top electrode 410. A dielectric layer 466 can be provided between the conductors, serving as an interlevel dielectric layer. The dielectric layer comprises, for example, silicon oxide. Other types of dielectric materials are also useful.

In one embodiment, a dielectric layer 485 is located between the conductor 450 and the strap. Preferably, the dielectric layer comprises a material which reduces or prevents oxidation of the conductor. The dielectric layer, for example, comprises silicon nitride. Providing multi-layered dielectric stack is also useful. For example, a silicon-nitride and silicon oxide dielectric stack can be used. The dielectric layer is particularly useful to isolate a passing conductor 450a located beneath the magnetic element. The passing conductor needs to be isolated from the magnetic element because it is associated with another magnetic cell. Such as arrangement can be advantageous to optimize the layout of the array.

In alternative embodiments, the conductor above the magnetic element can be coupled to the top electrode via a strap. Coupling both conductors to the magnetic element via straps is also useful. In yet another embodiment of the inventions, both conductors can be located above or below the magnetic element. One conductor can be coupled to magnetic element with a strap while the other is coupled without a strap. Alternatively, both conductors can be coupled to the magnetic element via straps.

Figure 5:
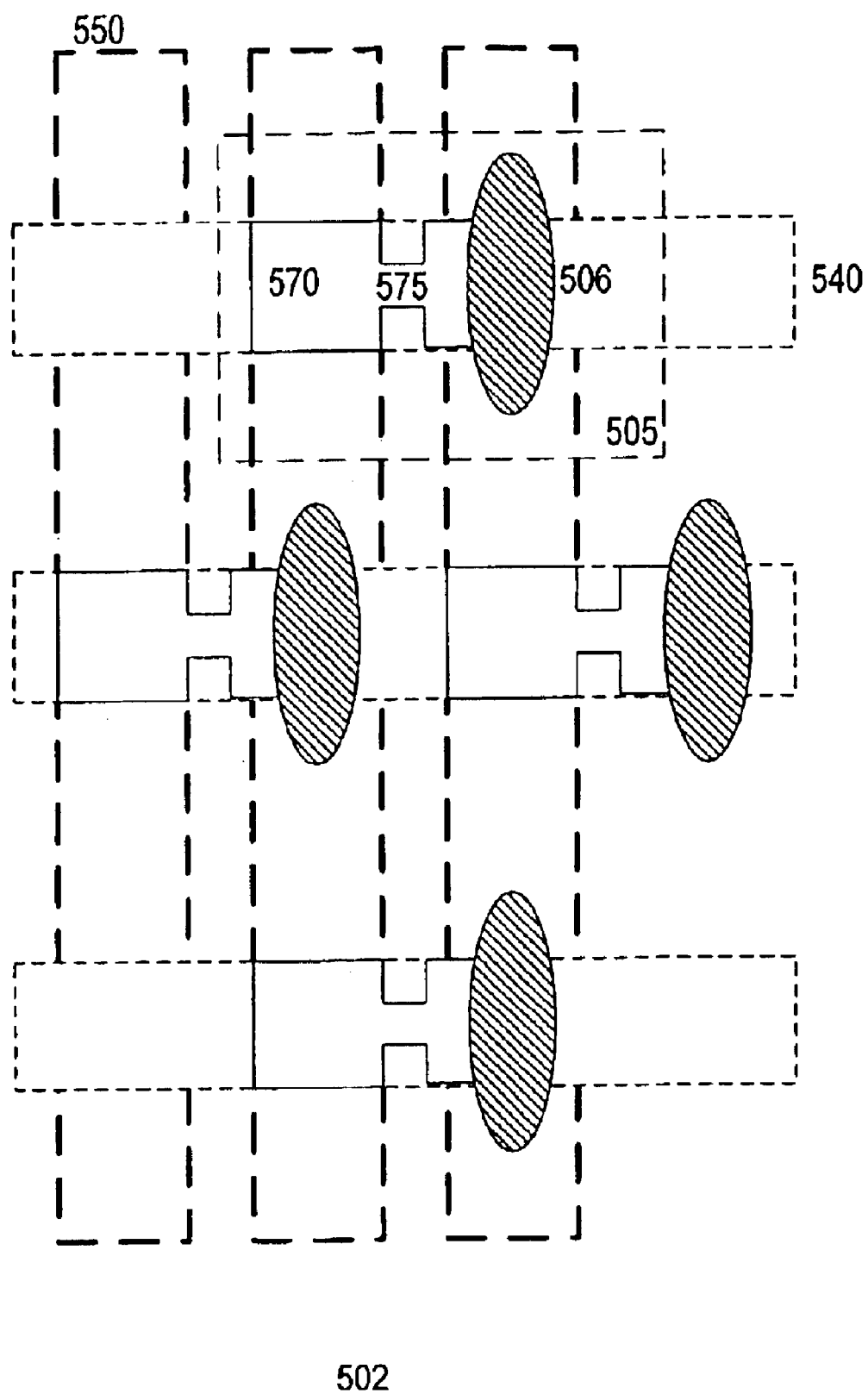
FIGS. 5–7 show various layout arrangements of memory array in accordance with the invention.

FIG. 5 shows a layout of a portion 502 of a memory array in accordance with one embodiment of the invention. The portion includes four magnetic memory cells 505, such as those described in FIG. 4. Of course, it is understood that an actual array comprises significantly more cells but four are shown for purposes of discussion.

As shown, the memory cells are arranged in columns and rows, interconnected by first conductors 540 (depicted by unbolded dotted lines) in the row direction and second conductors 550 (depicted by bolded dotted lines) in the column direction. In one embodiment, the first and second conductors are orthogonal to each other. Providing first and second conductors which intersect at other angles or are parallel is also useful. In one embodiment, magnetic elements 506 are elliptical in shape. Magnetic elements having other shapes (e.g., rectangular, oval, or square) are also useful. In one embodiment, the length or easy axis of the magnetic element, in one embodiment, is along the column direction. Providing the length or easy axis of the magnetic element in the row or other directions is also useful.

The memory cells are staggered. In one embodiment, the cells are staggered such that memory cells in every other column are aligned in a row, producing a checkered board arrangement. Other cell arrangements are also useful. A conductive strap 570 comprising a fuse portion 575 is provided for each memory cell. In one embodiment, the strap is coupled to a memory element and extends from there in the row direction. Alternatively, the extension of the strap in the row direction can be offset from the magnetic element (e.g., creating an L or T shaped strap and magnetic element combination). Other strap configurations or shapes can also be useful. For example, the strap can extend from the cell at different cell locations and/or in different directions. Adjacent memory cells are separated sufficiently to accommodate the fuse strap from a memory cell of an adjacent column.

In one embodiment, the second conductors in the column direction are coupled to the memory cells via straps while first conductors in the row direction are coupled to the memory cells directly or indirectly. Providing second conductors coupled to the memory cells directly or indirectly via contacts while first conductors are coupled to the memory cells via straps is also useful.

Figure 6:
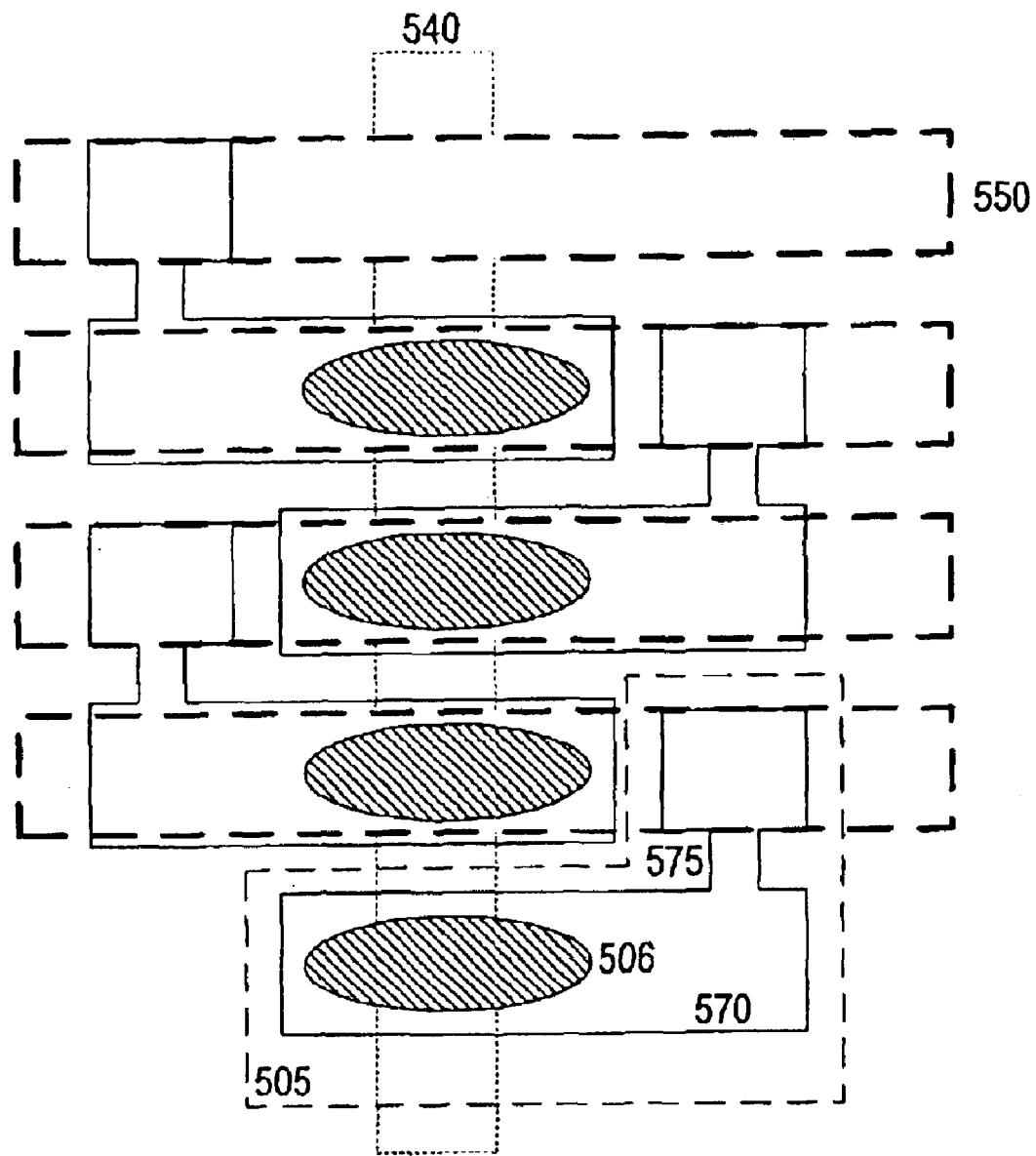
Figure 7:
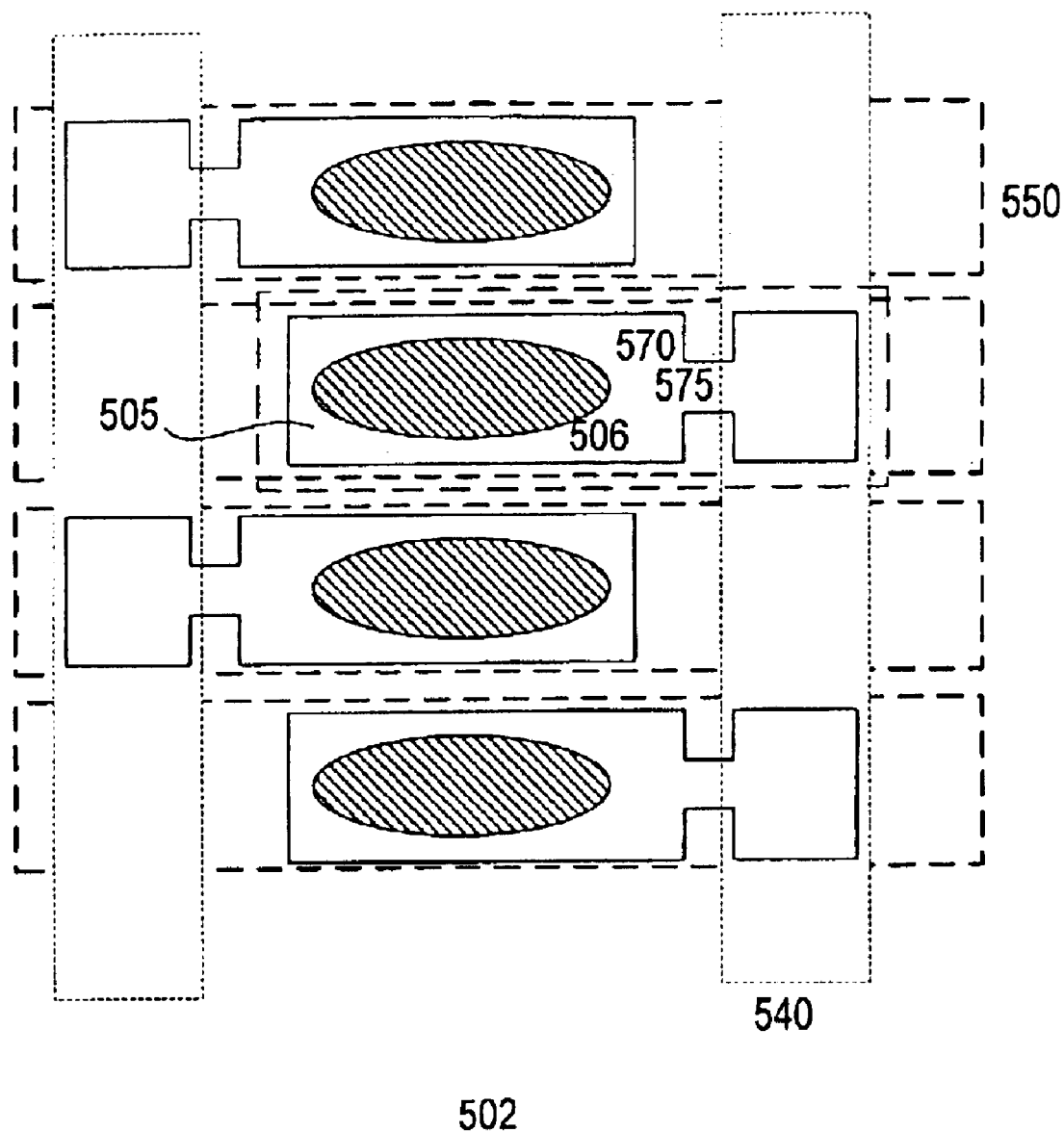

In alternative embodiments, the memory cells 505 of the array each includes a fuse strap 570 which extends from an end of the memory element or cell, as shown in FIGS. 6–7. The memory cells of adjacent columns are aligned in the row direction. Providing memory cells aligned in the column direction is also useful. Referring to FIG. 6, the strap extends from the end of the memory cell in the row direction. Alternatively, as shown in FIG. 7, the strap extends from the end of the memory cell in the column direction. In one embodiment, straps of adjacent memory cells of a row can extend from alternating ends of the cells. Providing straps which extend in different directions is also useful. Preferably, the cells are arranged to optimize use of chip area.

Figure 8:
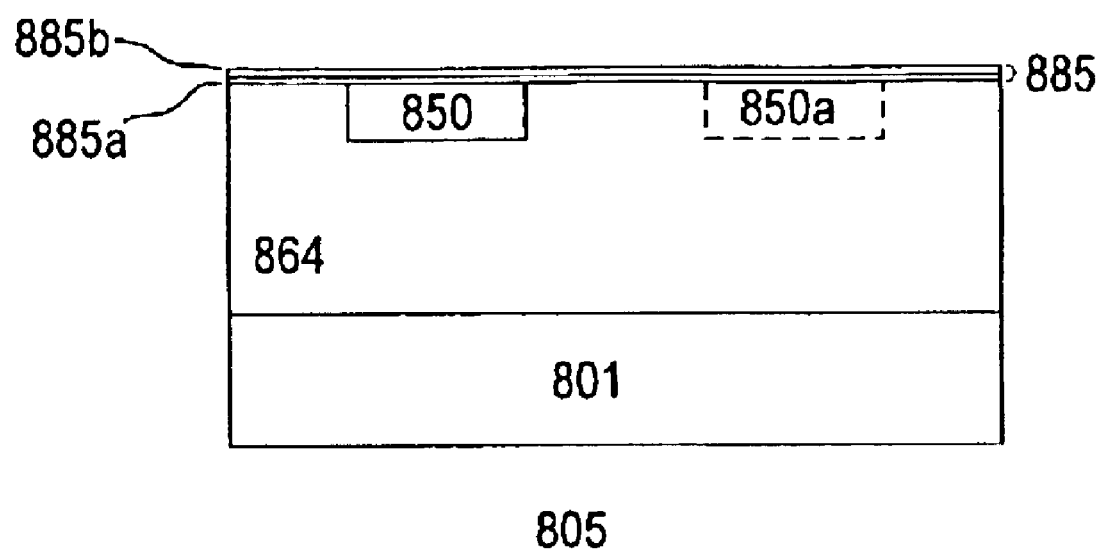
FIGS. 8–11 show a process for forming a memory cell in accordance with one embodiment of the invention.

FIGS. 8–11 show a process for fabricating a memory cell 805 in accordance with one embodiment of the invention. Although the figures depict only one memory cell, it is understood that a plurality of such memory cells can be formed. Referring to FIG. 8, a substrate 801 is provided. Typically, the substrate comprises silicon. Other types of substrates are also useful. The substrate is prepared with an interlevel dielectric (ILD) layer 864. The dielectric layer typically comprises silicon oxide. Other dielectric materials can also be used. Support circuitry for the IC can be located beneath the ILD layer. Such support circuitry includes, for example, decoders, drivers, and sense amplifiers. Other types of circuitry can also be used.

A first conductor 850 is formed in the dielectric layer. The conductor comprises, for example, Cu or an alloy thereof. Other conductive materials, such as aluminum or alloys thereof, are also useful. The first conductor is along a first direction. Other first conductors (e.g., 850a) can also be formed for other memory cells of the array. Adjacent conductors are separated by a distance equal to the line spacing. Typically, the line spacing is equal to the feature size (F). The feature size depends on, for example, lithographic resolution. Providing the conductors with other pitch size or line spacing is also useful.

The first conductor, for example, can be formed by damascene techniques. Such techniques include etching a trench in the dielectric layer and filling it with conductive material, such as copper. Other types of conductive materials (e.g., aluminum) are also useful. Excess conductive material is removed by, for example, chemical mechanical polishing (CMP), creating the conductor. Other techniques, such as RIE, are also useful. RIE comprises depositing a layer of conductive material, patterning it to form the conductor, depositing a dielectric layer over the conductor, and CMP stopping on the conductor. Providing conductors with a ferromagnetic liner is also useful.

After the conductors are formed, a dielectric layer 885 can be deposited over the substrate, covering the conductor and ILD layer. The dielectric layer serves, for example, to insulate adjacent first conductor 850a from the subsequently formed strap. In one embodiment, the dielectric comprises silicon oxide. Other dielectric materials, such as silicon nitride, are also useful. Providing a dielectric layer with multiple layers is also useful.

In one embodiment, the dielectric layer comprises first and second sublayers 885a–b. Preferably, the layers can be etched selective to each other. More preferably, the sublayer covering the conductors comprises non-oxidizing material. This is particularly useful for conductors formed from materials which are sensitive to oxidation, such as copper. In one embodiment, the first and second sublayers comprise silicon nitride and silicon oxide. Various techniques can be used to deposit the sublayers. For example, chemical vapor deposition or thermal oxidation can be used. Preferably, the silicon nitride is deposited by HDP CVD and silicon oxide is deposited by PE-CVD. Alternatively, the dielectric layer can comprise a single layer, such as silicon nitride. Other dielectric materials are also useful.

Figure 9:
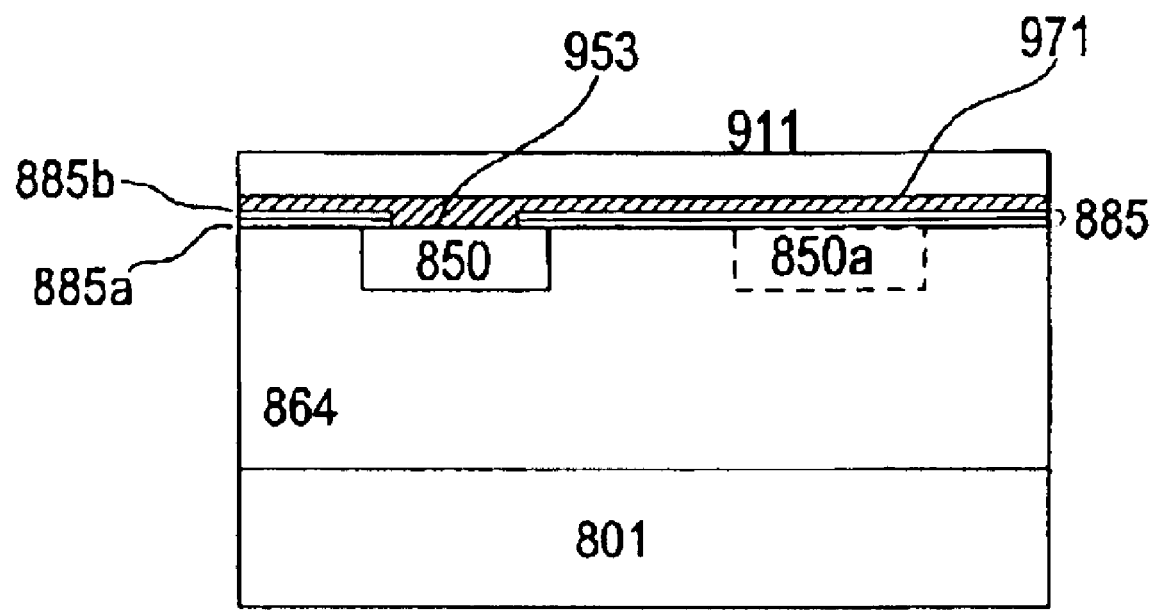

Referring to FIG. 9, the dielectric layer is patterned to create a contact opening 953 to the first conductor 850. The contact opening can be created using conventional lithographic techniques. For example, a photoresist layer is deposited and patterned to create an etch mask with an opening corresponding to the contact opening. An anisotropic etch, such as RIE, is performed to remove the dielectric layer unprotected by the etch mask. Other types of etch techniques can also be useful.

In one embodiment, the RIE is selective to the first dielectric sublayer. This results in removal of the silicon oxide material but not the silicon nitride. After the RIE, the etch resist mask is removed. An anisotropic etch selective to silicon oxide is then performed to remove the portions of the silicon nitride material, exposing the first conductor. In one embodiment, the etch comprises an RIE. A wet clean can be performed to remove any etch by-products, such as polymer, from the contact. Other techniques for creating the opening to the first conductor are also useful.

A conductive layer 971 is deposited on the substrate, filling the contact opening and covering the surface of the dielectric layer. In one embodiment, the conductive layer comprises tantalum nitride. Other conductive materials, such as Ta or Cu, are also useful.

In one embodiment, various layers 911 which make up the magnetic stack are then deposited over the conductive layer. The various layers, for example, include first and second ferromagnetic electrode layers separated by an intermediate layer. The electrode layer comprises, for example, nickel-iron, nickel-iron-cobalt, or cobalt iron. Other types of ferromagnetic materials are also useful. It is understood that the first and second electrodes need not be formed of the same materials. The intermediate layer comprises a non-magnetic layer. In one embodiment, the intermediate layer comprises a dielectric layer, such as aluminum oxide. Other types of dielectric can also be useful. Alternatively, the intermediate layer comprises a conductive material. Providing other or additional layers that are used to form other types of magnetic elements are also useful. For example, additional layers, such as those which serve to pin the vectors of the reference layer and/or to decrease switching force of the magnetic vector of the storage layer, can also be included. The various layers can be deposited using conventional techniques, such as PVD.

Figure 10:
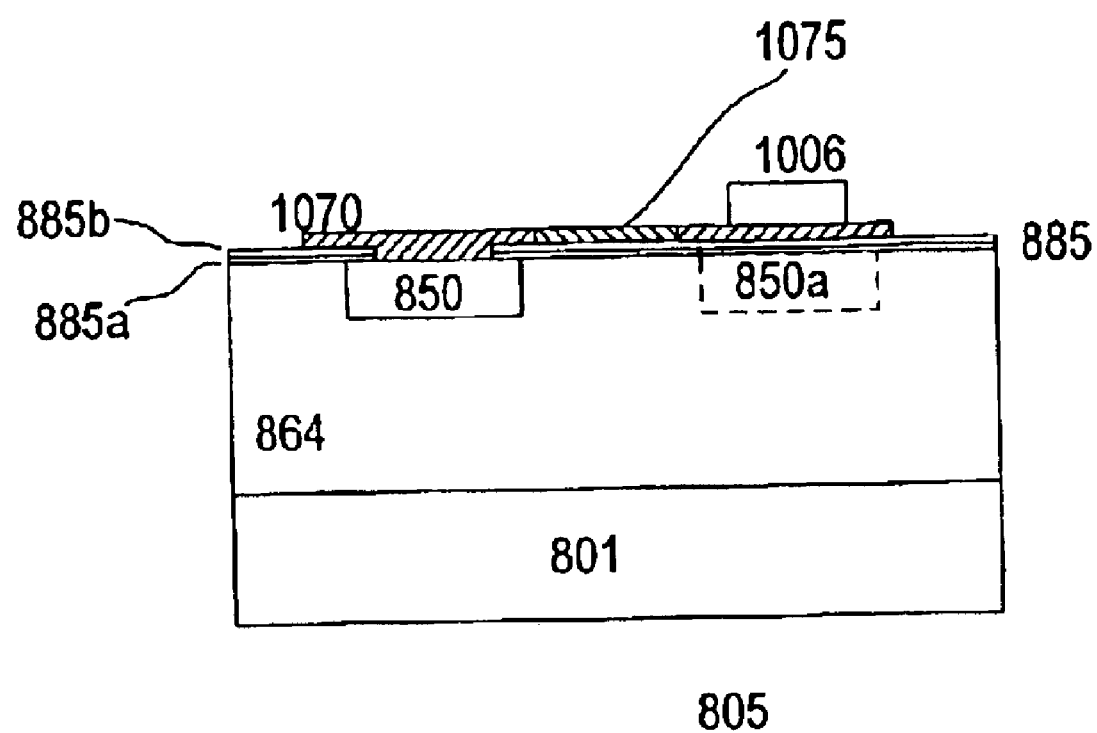

In one embodiment, the various layers of the magnetic stack are patterned, forming magnetic element 1006, as shown in FIG. 10. Conventional techniques can be used to pattern the various layers to form the magnetic element. For example, a hard mask can be deposited on the substrate and patterned to create an etch mask. The various layers are then etched using chlorinated or fluorinated chemistry. In one embodiment, the various layers are etched selective to the conductive layer. The etch removes the various layers unprotected by the etch mask, exposing the conductive layer.

After the magnetic element is formed, the exposed conductive layer is patterned to form a conductive strap 1070. In accordance with one embodiment of the invention, the conductive layer is patterned to form a conductive strap with a fuse portion 1075. Preferably, the fuse portion comprises a width narrower than the width of the non-fuse portion of the strap. Conventional mask and etch techniques can be used to form the conductive strap. In an alternative embodiment, the conductive layer can be patterned to form the conductive strap followed by deposition and patterning of the various layers to form the magnetic element.

Figure 11:
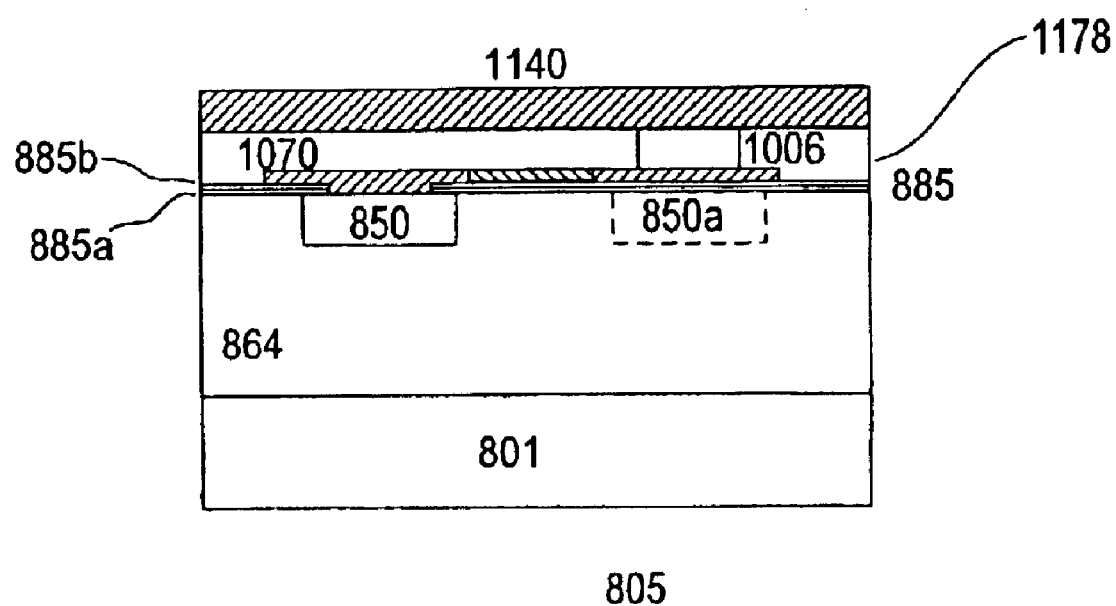

Referring to FIG. 11, an ILD layer 1178 is deposited on the substrate. Preferably, the ILD layer is sufficiently thick to accommodate another conductor 1140 which is formed by damascene techniques. In one embodiment, the second conductor is formed by dual damascene techniques. Such techniques include forming a contact opening to electrode of the magnetic element, etching a trench in the ILD layer to accommodate the conductor, depositing conductive material to fill the contact opening and trench, and planarizing the surface of the substrate to remove excess conductive material. Forming the second conductor using single damascene techniques is also useful. Single damascene techniques include, for example, etching a trench in the ILD layer which exposes the electrode, filling the trench with conductive material, and removing excess conductive material. Other techniques for forming the conductor, such as RIE, are also useful. The process continues to, for example, complete the fabrication of the memory cell and the IC.

While the invention has been particularly shown and described with reference to various embodiments, it will be recognized by those skilled in the art that modifications and changes may be made to the present invention without departing from the spirit and scope thereof. The scope of the invention should therefore be determined not with reference to the above description but with references to the appended claims along with their full scope of equivalents.

What is claimed is:

1. A magnetic memory cell comprising:
   a magnetic element comprising first and second electrodes;
   a first conductor coupled to the first electrode of the magnetic element;
   a second conductor; and
   a conductive strap coupling the second conductor to the second electrode,
   wherein the coupling is offset by a distance x, the conductive strap comprises fuse portion which can be severed to decouple the second conductor from the magnetic element.

2. The magnetic memory cell of claim 1 wherein the first and second electrodes are separated by an intermediate layer.

3. The magnetic memory cell of claim 2 wherein the intermediate layer comprises a non-conductive material.

4. The magnetic memory cell of claim 2 wherein the intermediate layer comprises aluminum oxide.

5. The magnetic memory cell of claim 1 wherein the conductive strap comprises tantalum nitride.

6. The magnetic memory cell of claim 1 wherein the first and second conductors comprises a conductive material selected from aluminum, copper, alloy or a combination thereof.

7. The magnetic memory cell of claim 6 wherein the conductive strap comprises tantalum nitride.

8. The magnetic memory cell of claim 1 wherein x is equal to about a feature size.

9. The magnetic memory cell of claim 1 wherein x is equal to about a line pitch.

10. The magnetic memory cell of claim 1 wherein the fuse portion comprises an electrically blowable fuse portion.

11. The magnetic memory cell of claim 10 wherein the electrically blowable fuse portion comprises a width which is narrower than a non-fuse portion of the strap.

12. The magnetic memory cell of claim 10 wherein the electrically blowable fuse portion can be blown by passing an elevated current through the strap.

13. The magnetic memory cell of claim 10 wherein the first electrode is above the second electrode or the first electrode is below the second electrode.

14. The magnetic memory cell of claim 13 wherein the electrically blowable fuse portion comprises a width which is narrower than a non-fuse portion of the strap.

15. The magnetic memory cell of claim 13 wherein the electrically blowable fuse portion can be blown by passing an elevated current through the strap.

* * * * *